United States Patent
Liao et al.

(10) Patent No.: US 9,607,873 B2
(45) Date of Patent: Mar. 28, 2017

(54) APPARATUS AND OPERATION METHOD THEREOF

(71) Applicant: TAIWAN SEMICONDUCTOR MANUFACTURING COMPANY LTD., Hsinchu (TW)

(72) Inventors: Si-Wen Liao, Hsinchu (TW); Jia-Wei Xu, Taichung (TW); Mao-Cheng Lin, Changhua County (TW); Chien-Cheng Wu, New Taipei (TW); Lan-Hai Wang, Hsinchu County (TW); Ding-I Liu, Hsinchu (TW); Fu-Shun Lo, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 443 days.

(21) Appl. No.: 14/175,693

(22) Filed: Feb. 7, 2014

(65) Prior Publication Data

US 2015/0228516 A1 Aug. 13, 2015

(51) Int. Cl.
*H01L 21/67* (2006.01)
*H01L 21/677* (2006.01)
*H01L 21/673* (2006.01)

(52) U.S. Cl.
CPC .. *H01L 21/67775* (2013.01); *H01L 21/67389* (2013.01)

(58) Field of Classification Search
CPC ............... H01L 21/67775; H01L 21/67389
(Continued)

(56) References Cited

U.S. PATENT DOCUMENTS 5,788,448 A * 8/1998 Wakamori ........ H01L 21/67757
414/222.02
5,879,458 A * 3/1999 Roberson, Jr. .... H01L 21/67017
118/715
(Continued)

FOREIGN PATENT DOCUMENTS

CN 1525529 A 9/2004
TW 200949972 12/2009
(Continued)

OTHER PUBLICATIONS

Office Action issued on Oct. 26, 2015 for the Taiwanese counterpart application 103145655.
(Continued)

*Primary Examiner* — Nicolas A Arnett
(74) *Attorney, Agent, or Firm* — WPAT, P.C., Intellectual Property Attorneys; Anthony King

(57) ABSTRACT

An apparatus includes a body and a surface for receiving a semiconductor wafer carrier is provided. A nozzle and a venting hole are provided on the surface. The semiconductor wafer carrier has at least one selectively closable capped opening at a bottom, top and/or side surface thereof. The capped opening is configured to couple to, and be accessible by, the nozzle and receive gas output from the nozzle so as to create a substantially oxygen free environment within the semiconductor wafer carrier. The vent hole is configured to allow gas to flow out of the semiconductor wafer carrier. In addition, the apparatus includes a sensor and a controller. The sensor is configured to monitor an ambient condition in the semiconductor wafer carrier, and the controller is configured to adjust a control valve based on the ambient condition so as to control the gas flow or output from the nozzle.

20 Claims, 13 Drawing Sheets

(58) Field of Classification Search
USPC ........ 141/4, 63, 65–66, 83, 94, 98; 414/935, 414/937, 939
See application file for complete search history.

(56) References Cited

U.S. PATENT DOCUMENTS

| | | | | |
|---|---|---|---|---|
| 6,994,507 | B2* | 2/2006 | Matsumoto | G03F 7/70741 355/30 |
| 7,507,264 | B2* | 3/2009 | Matsumoto | G03F 7/70741 257/E21.027 |
| 9,010,384 | B2* | 4/2015 | Yoshimura | H01L 21/67772 141/63 |
| 2001/0042439 | A1* | 11/2001 | Roberson, Jr. | H01L 21/67017 95/8 |
| 2003/0063965 | A1 | 4/2003 | Langan et al. | |
| 2004/0168765 | A1* | 9/2004 | Matsumoto | G03F 7/70741 156/345.3 |
| 2005/0281639 | A1* | 12/2005 | Matsumoto | G03F 7/70741 414/217 |
| 2007/0151619 | A1* | 7/2007 | Okabe | H01L 21/67772 141/63 |
| 2009/0053017 | A1* | 2/2009 | Shmuelov | H01L 21/67017 414/217 |
| 2009/0169342 | A1* | 7/2009 | Yoshimura | H01L 21/67772 414/217 |
| 2013/0000757 | A1* | 1/2013 | Yoshimura | H01L 21/67772 137/561 R |
| 2013/0326841 | A1 | 12/2013 | Natsume et al. | |

FOREIGN PATENT DOCUMENTS

| | | |
|---|---|---|
| TW | 201001599 | 1/2010 |
| TW | 201110259 A | 3/2011 |
| TW | M418330 | 12/2011 |
| WO | WO 02/093622 A2 | 11/2002 |

OTHER PUBLICATIONS

Office Action issued on Jul. 11, 2016 for the Taiwanese counterpart application 103145655.

* cited by examiner

APPARATUS AND OPERATION METHOD THEREOF

FIELD

The present disclosure relates to an apparatus and operation method thereof, more particular to a semiconductor manufacturing apparatus.

BACKGROUND

In the manufacturing of semiconductor wafers, manufacturing equipment include many apparatuses for performing the various processes. Each of the apparatuses has a corresponding operation environment, e.g. oxygen-rich, oxygen-poor, oxygen-free, and high vacuum environments. If there is deviation of the operation environment, undesired defect would form accordingly. For example, in a thin film process, particles caused by unexpected oxidation may substantially damage the yield of semiconductor wafers. Therefore, a well controlled working environment is needed to ensure delivery of high quality products on a consistent basis.

Working environment control is challenging to a modern semiconductor fabrication facility because the ball room becomes larger for accommodating more equipments than before. To save the cost, the ball room is typically maintained at a constant temperature and humidity, but possibly not appropriate to semiconductor wafers at certain stages. Thus, semiconductor wafers are usually kept in a pod with mini-environment during transportation or in queue to prevent any cross contamination. However, it is unavoidable that semiconductor wafers are exposed to the ambient environment or atmosphere during certain processes, especially during the transfer from an opened pod to a manufacturing equipment. Therefore, unexpected defect(s) might form on semiconductor wafers and their origins are often difficult to trace. Under some circumstances, semiconductor wafers left in an environment over a predetermined period of time, i.e., queue time (Q-time), will also increase the chance of unexpected defects.

In view of the foregoing, it is greatly desired to develop an apparatus or method to prevent defects in the semiconductor wafers particularly when the gas tight seal of the pod needs to be broken, or when the wafer(s) have remained in an environment over an extended period of time.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

Like reference symbols in the various drawings indicate like elements.

DETAILED DESCRIPTION OF THE DISCLOSURE

Figure 1:
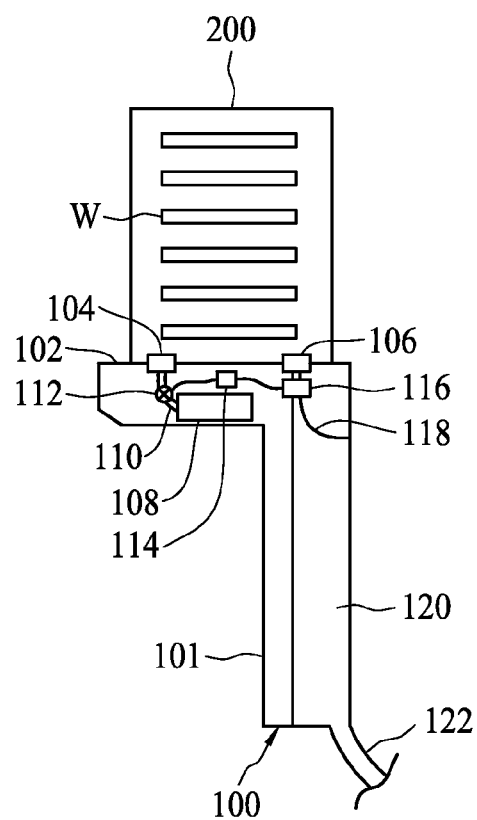
FIG. 1 is a cross-sectional view of part of a semiconductor wafer process system having an apparatus in accordance with some embodiments of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

It will be understood that when an element is referred to as being "on" another element, it can be directly on the other element or intervening elements may be present. In contrast, when an element is referred to as being "directly on" another element, there are no intervening elements present.

It will be understood that singular forms "a", "an" and "the" are intended to include the plural forms as well, unless the context clearly indicates otherwise. Furthermore, relative terms, such as "bottom" and "top," may be used herein to describe one element's relationship to other elements as illustrated in the Figures.

It will be understood that elements described as "under" or "below" other elements would then be oriented "over" or "above" the other elements. The exemplary terms "under" or "below" can, therefore, encompass both an orientation of over and under.

Unless otherwise defined, all terms (including technical and scientific terms) used herein have the same meaning as commonly understood by one of ordinary skill in the art to which the embodiments of the present disclosure belongs. It will be further understood that terms; such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a cross-sectional view of part of a semiconductor wafer process system having an apparatus in accordance with some embodiments of the present disclosure.

Referring to FIG. 1, a load port 100 is provided. The load port 100 has a body 101 and a surface 102 configured to receive a semiconductor wafer carrier 200. The semiconductor wafer carrier 200 is moved between different load ports or semiconductor wafer process systems by means of, for example, an overhead hoist transfer (OHT) system (not depicted). For example, the OHT system is configured to grab and lift a semiconductor wafer carrier from an upper surface of one load port, and move the semiconductor wafer carrier to an upper surface of another load port to be received. In some embodiments, the OHT system is remotely configured by a central control unit such that no two semiconductor wafer carriers will arrive at one stage or station at the same time.

Referring to FIG. 1, the semiconductor wafer carrier 200 is configured to receive and accommodate semiconductor wafers W so as to allow the semiconductor wafers W to be moved between different load ports or semiconductor wafer process systems (not depicted). In some embodiments in accordance with the present disclosure, the semiconductor wafer carrier 200 is a pod. In certain embodiments, the semiconductor wafer carrier 200 is a Front Opened Unified Pod (FOUP) designed to be operated by a Front-Opening Interface Mechanical Standard (FIMS) system.

In some embodiments in accordance with the present disclosure, the load port 100 has a nozzle 104 and a venting hole 106, or vent port, on the surface 102. The nozzle 104 is configured to provide a gas output from a gas source 108 via a gas line 110 into the semiconductor wafer carrier 200. Moreover, the venting hole 106 is configured to lead gas out of the semiconductor wafer carrier 200. In some embodiments, the gas provided into the semiconductor wafer carrier 200 is an inert gas. Inert gas serves to lower the possibility of undesired defects developed on the semiconductor wafer W accommodated in the semiconductor wafer carrier 200. In certain embodiments, the gas provided is nitrogen. Before the gas is provided by the nozzle 104 into the semiconductor wafer carrier 200, the oxygen concentration within the semiconductor wafer carrier 200 level in at a certain level. After the gas is provided by the nozzle 104, the air and/or gas in the semiconductor wafer carrier 200 is purged or replaced by the gas provided or flowed into the semiconductor wafer carrier 200, and a substantially oxygen free environment is generated in the semiconductor wafer carrier 200. The term "substantially oxygen free environment" used in the present disclosure is to define an environment having an oxygen concentration below about 5.0% to about 10.0%. In certain embodiments, the term "substantially oxygen free environment" used in the present disclosure is to define an environment having an oxygen concentration below about 3.0%. In some embodiments, a term "oxygen poor" is another alternative definition to replace "substantially oxygen free environment" in the present disclosure.

In some embodiments in accordance with the present disclosure, the nozzle 104 is connected to the gas source 108 through a gas line 110. The gas source 108 is within the load port. In certain embodiments, the gas source 108 is located outside or external of the load port, and configured to be connected to the nozzle 104 through the gas line 110.

In some embodiments in accordance with the present disclosure, the gas source 108 is configured to provide gas through the nozzle 104 and into the semiconductor wafer carrier 200 continuously. In certain embodiments, the load port 100 includes a control valve 112 for manipulating the gas provided into the semiconductor wafer carrier 200. For example, the control valve 112 is configured to control the flow speed or the amount of the gas provided.

In some embodiments in accordance with the present disclosure, the load port 100 includes a controller 114 connected to the control valve 112. The controller 114 is configured to control the control valve 112 so as to manipulate the output of the nozzle 104. For example, the controller 114 is programmed to allow gas output for a predetermined period of the whenever a semiconductor wafer carrier 200 is received by the load port 100. In certain embodiments, the controller 114 is manually adjusted so as to manipulate different types of gas output from the nozzle 104.

In some embodiments in accordance with the present disclosure, the load port 100 includes a sensor 116 connected to the controller 114. The sensor 116 is disposed proximal to the venting hole 106 so as to monitor an ambient condition within the semiconductor wafer carrier 200. In some embodiments, the sensor 116 is connected to an exhaust pipe 118 connecting the venting hole 106 and an exhaust buffer 120. The exhaust buffer 120 is then connected to a foreline 122 to lead the gas purged out of the semiconductor wafer carrier 200 out of the load port 100. Accordingly, the sensor 116 is configured to detect the ambient condition of the gas purged out of the semiconductor wafer carrier 200. In certain embodiments, the sensor 116 is connected to a detection pipe extending into the inner space of the semiconductor wafer carrier 200. In certain embodiments, the sensor 116 is disposed proximal to the nozzle 104 so as to detect the ambient condition of the gas output by the nozzle 104.

In some embodiments in accordance with the present disclosure, the controller 114 receives the ambient condition detected by the sensor 116. Then, the controller 114 adjusts the control valve 112 based on the ambient condition so as to manipulate the output provided by the nozzle 104. In other words, after receiving the ambient condition from the sensor 116, the controller 114 compares the ambient condition with predetermined values stored in a memory. When an ambient condition reaches, passes, or decreases below a certain value, the controller 114 is configured to react and adjust the control valve 112 so as to manipulate the output of the nozzle 104.

In some embodiments in accordance with the present disclosure, the sensor 116 includes a flow meter disposed proximal to the nozzle 104. The flow meter is configured to monitor a flow speed of the gas output from the nozzle 104.

A gas with flow speed exceeding a predetermined value may affect the stability of the wafers W in the semiconductor wafer carrier 200. For example, a flow speed exceeding a predetermined limit might cause the wafers W to shake, which may lead to defects at the wafers W thus affecting the final yield.

In some embodiments in accordance with the present disclosure, the sensor 116 includes a humidity sensor proximal to the venting hole 106. In some embodiments, the sensor 116 is located downstream of the venting hole 106 in the direction of the gas flow through the venting hole 106. The humidity sensor is configured to monitor a humidity level in the semiconductor wafer carrier 200. In certain embodiments, when a humidity level in the semiconductor wafer carrier 200 is above about 20%, the controller 114 is configured to adjust the control valve 112 to provide gas output so as to purge the semiconductor wafer carrier 200 as required to maintain the desired condition within the semiconductor wafer carrier 200.

In some embodiments in accordance with the present disclosure, the sensor 116 includes an oxygen sensor proximal to the venting hole 106. In some embodiments, the sensor 116 is located downstream of the venting hole 106 in the direction of the gas flow through the venting hole. The oxygen sensor is configured to monitor an oxygen concentration in the semiconductor wafer carrier 200. The oxygen sensor is a chemical oxygen sensor or an optical oxygen sensor. In certain embodiments, when an oxygen concentration in the semiconductor wafer carrier 200 is above about 2%, the controller 114 is configured to adjust the control valve 112 to provide gas output so as to purge the semiconductor wafer carrier 200.

In some embodiments in accordance with the present disclosure, the sensor 116 is a pressure sensor. The pressure sensor is configured to monitor a pressure level in the semiconductor wafer carrier 200 or a pressure difference between the inner space of the semiconductor wafer carrier 200 and the outer atmosphere. In certain embodiments, a pressure difference between the inner space and the atmosphere outside the semiconductor wafer carrier 200 is between about 500 Pa and about −500 Pa.

Figure 2:
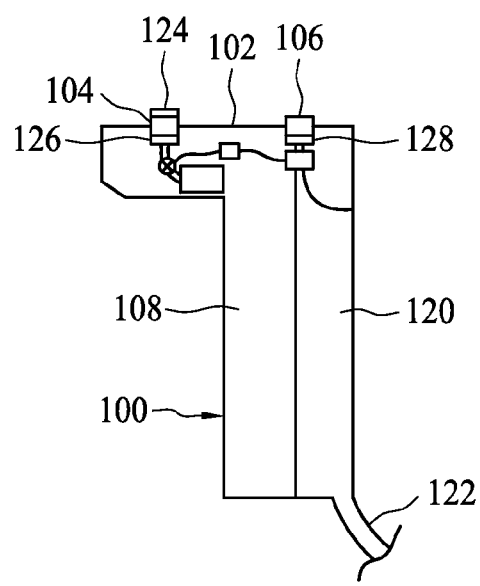
FIG. 2 is a cross-sectional view of part of a semiconductor wafer process system having an apparatus in accordance with some embodiments of the present disclosure.

FIG. 2 is a cross-sectional view of part of a semiconductor wafer process system having an apparatus in accordance with some embodiments of the present disclosure.

Referring to FIG. 2, in some embodiments, the load port 100 includes a diffuser 124 at the nozzle 104. The diffuser 124 is configured to provide a more uniform gas output into the semiconductor wafer carrier 200. The diffuser 124 also provides another function of adjusting flow direction, speed or rate of the gas output by the nozzle 104. Accordingly, the stableness of the wafers W in the semiconductor wafer carrier 200 is maintained. In certain embodiments, the diffuser 124 is disposed over the nozzle 104.

In some embodiments in accordance with the present disclosure, the load port 100 includes a filter 126 in the nozzle 104. The filter 126 is configured to reduce particles or contaminants in the gas output. In certain embodiments, the filter 126 is a chemical filter configured to remove chemical contaminants contained in the gas introduced from the gas source 108. In some embodiments, the filter 126 includes an activated carbon filter. In some embodiments, the filter is disposed in upstream of the nozzle in the direction of gas flow through the nozzle.

In some embodiments in accordance with the present disclosure, the load port 100 includes a suction unit 128 at the venting hole 106. The suction unit 128 is configured to vacuum the semiconductor wafer carrier 200 by providing a suction force to pull gas out of the semiconductor wafer carrier 200. In certain embodiments, the suction unit 128 is a pump. In some embodiments, the suction unit is a fan.

FIGS. 3A to 3D illustrate a part of a semiconductor wafer process system having an apparatus in accordance with some embodiments of the present disclosure.

Figure 3A:
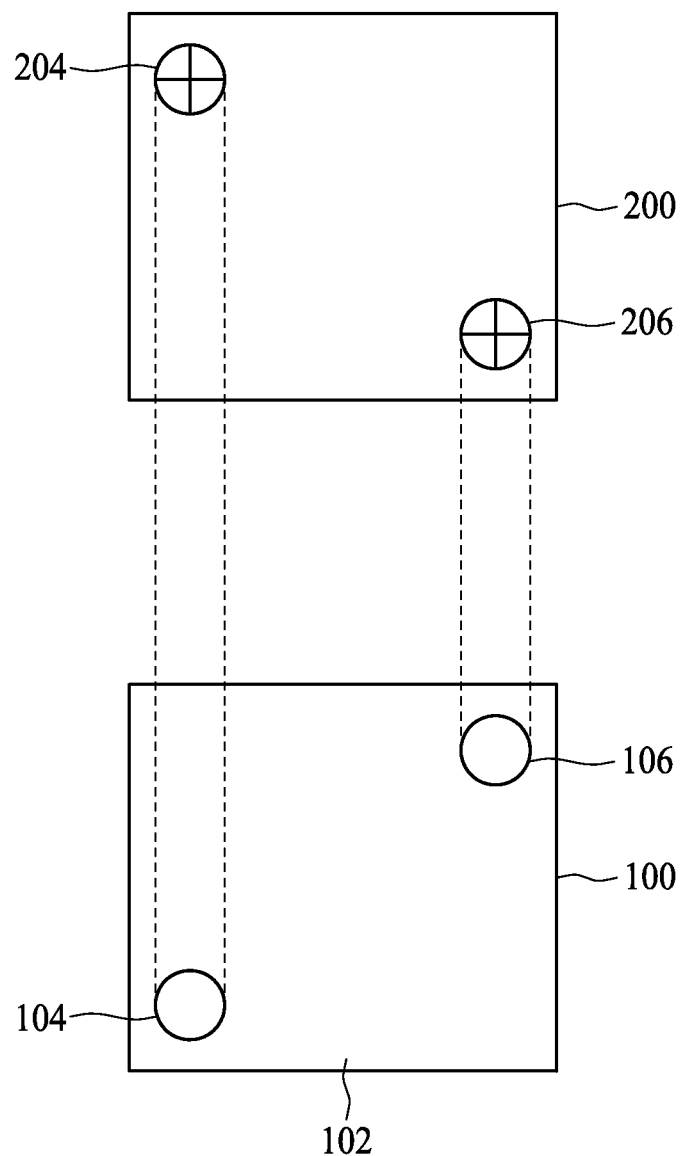
FIGS. 3A to 3D illustrate a part of a semiconductor wafer process system having an apparatus in accordance with some embodiments of the present disclosure.
Figure 3B:
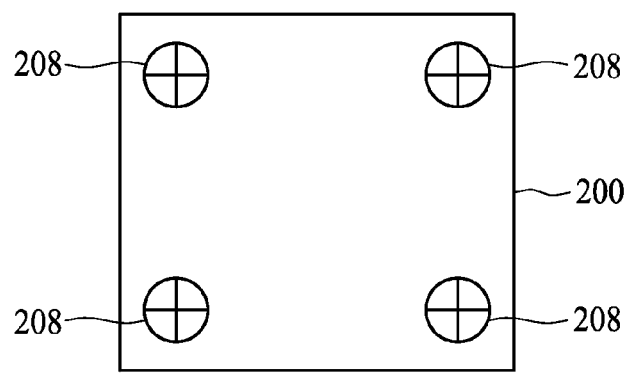
Figure 3B:
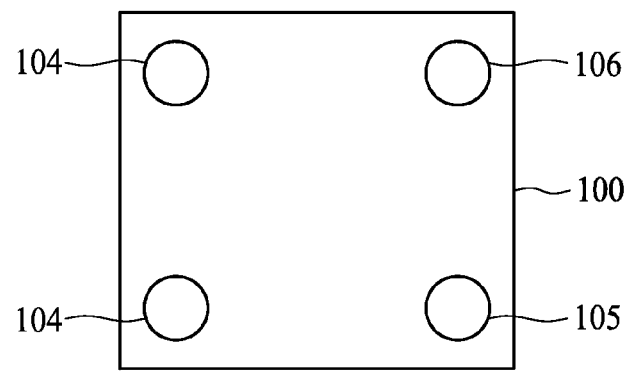

Referring to FIGS. 3A and 3B, a load port 100 and a corresponding semiconductor wafer carrier 200 in accordance with some embodiments of the present disclosure are provided. In FIGS. 3A and 3B, top views of the load port 100, and bottom views of the semiconductor wafer carrier 200 are provided.

Referring to FIG. 3A, in accordance with some embodiments of the present disclosure, the surface 102 of the load port 100 includes a nozzle 104 and a venting hole 106. The bottom surface of the semiconductor wafer carrier 200 includes a first capped opening 204 which corresponds to the nozzle 104 and a second capped opening 206 which corresponds to the venting hole 106. Generally, the capped openings provide a barrier between the inner space of the semiconductor wafer carrier 200 and the outer atmosphere. In some embodiments, the capped opening 204, 206 includes an auto-recoverable mechanism capable of allowing penetration of the nozzle 104 or the venting hole 106, and returning to its previous condition to seal the semiconductor wafer carrier 200 when the nozzle 104 or the venting hole 106 is not present. In other words, when the semiconductor wafer carrier 200 is received by the load port 100, the capped openings are accessible by the nozzle 104 and the venting hole 106. Accordingly, passageway(s) are formed and configured for introducing gas into the semiconductor wafer carrier 200, such as through the nozzle 104, and out of the semiconductor wafer carrier 200, such as through the venting hole 106. In other words, gas is introduced into the semiconductor wafer carrier 200 by the nozzle 104 through the first capped opening 204, and lead out of the semiconductor wafer carrier 200 by the venting hole 106 through the second capped opening 206.

Referring to FIG. 3B, in accordance with some embodiments of the present disclosure, the surface 102 of the load port 100 includes two nozzles 104 and two venting holes 106. The bottom surface of the semiconductor wafer carrier 200 includes capped openings 208 which correspond to the nozzles 104 and the venting holes 106. When the semiconductor wafer carrier 200 is received by the load port 100, the nozzles 104 are configured to provide gas into the semiconductor wafer carrier 200, and the venting holes 106 are configured to lead gas out of the semiconductor wafer carrier 200.

Figure 3C:
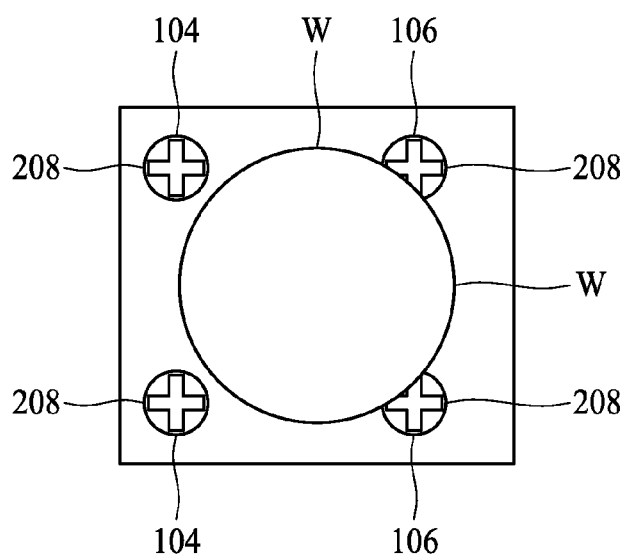

FIG. 3C is a top view of the semiconductor wafer carrier 200 mounted on the load port 100, which is obstructed by the semiconductor wafer carrier 200 and therefore not depicted. In some embodiments in accordance with the present disclosure, when received by the load port 100, the capped openings 208 of the semiconductor wafer carrier 200 are accessible by the nozzles 104 and the venting holes 106 of the load port. Accordingly, gas is introduced into the semiconductor wafer carrier 200 through the nozzles 104 and out of the semiconductor wafer carrier 200 through the venting holes 106. In certain embodiments, the nozzles 104 are configured at positions where path of the gas output will not be directly obstructed by the wafers W.

Figure 3D:
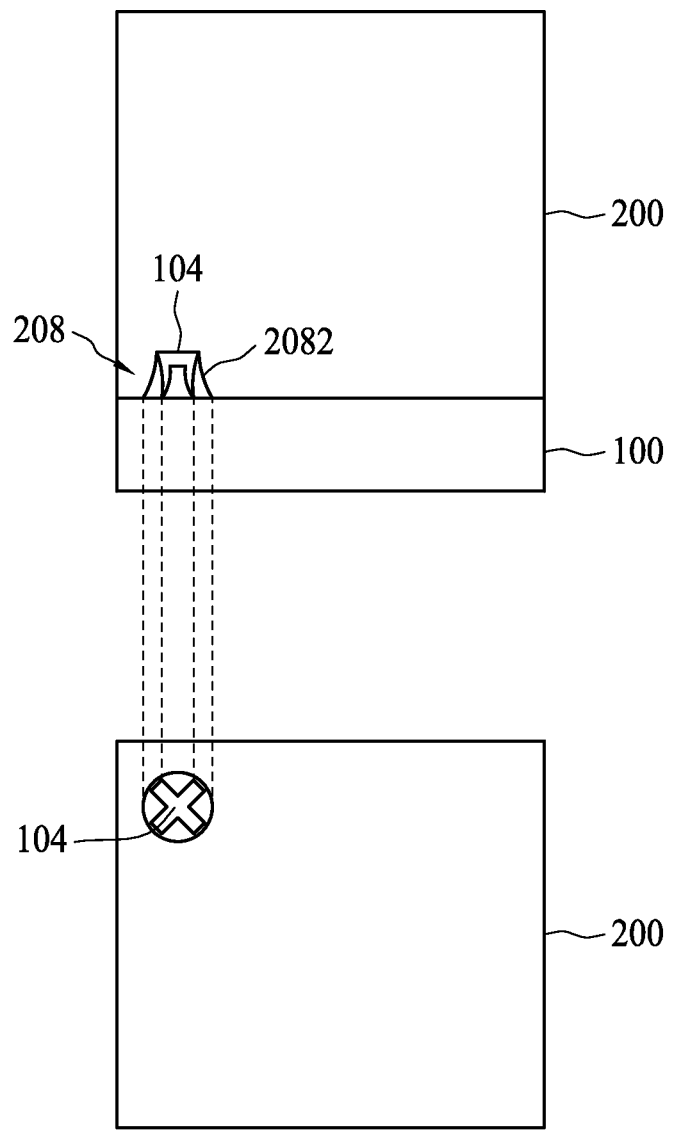

The upper portion of FIG. 3D illustrates a side view of part of the semiconductor wafer carrier 200 mounted on the load port 100 in accordance with the present disclosure. The lower portion of FIG. 3D illustrates a top view of part of the semiconductor wafer carrier 200 mounted on the load port 100 in accordance with the present disclosure (The load port 100 is below the semiconductor wafer carrier 200 and therefore obstructed). Only one capped opening 208 and nozzle 104 are presented. Other capped openings 208 and the venting holes 106 are omitted for clarity.

Referring to FIG. 3D, the capped opening 208 has at least two flaps 2082. In some embodiments, the capped opening 208 has four flaps 2082. The flaps 2082 are configured to be accessed by the nozzle 104 when the semiconductor wafer carrier 200 is received by the load port 100. When the semiconductor wafer carrier 200 is not placed on the load port 100, the flaps 2082 are in tight (e.g. air-tight) contact with each other. Accordingly, the capped opening 208 is closed by the flaps 2082, and air or gas outside the semiconductor wafer carrier 200 is prevented from entering the interior volume or space of the semiconductor wafer carrier 200. As the semiconductor wafer carrier 200 is being lowered onto the load port 100, the nozzle 104 is configured to push against and separate the flaps 2082. When the semiconductor wafer carrier 200 is placed on to the load port 100, the nozzle 104 pushes through the flaps 2082, and a passageway or flow path is established between the semiconductor wafer carrier 200 and the load port 100. Inert gas or nitrogen is provided through the nozzle 104 to generate a substantially oxygen free environment in the semiconductor wafer carrier 200. In certain embodiments, the capped opening 208 includes a membrane configured to seal the semiconductor wafer carrier 200. The membrane is generally not accessible but when supplied with pressure, gas may penetrate through the membrane. For example, when the pressure of the gas provided by the nozzle 104 against the membrane reaches a certain value, the gas can flow across or through the membrane and into the semiconductor wafer carrier 200.

Figure 4:
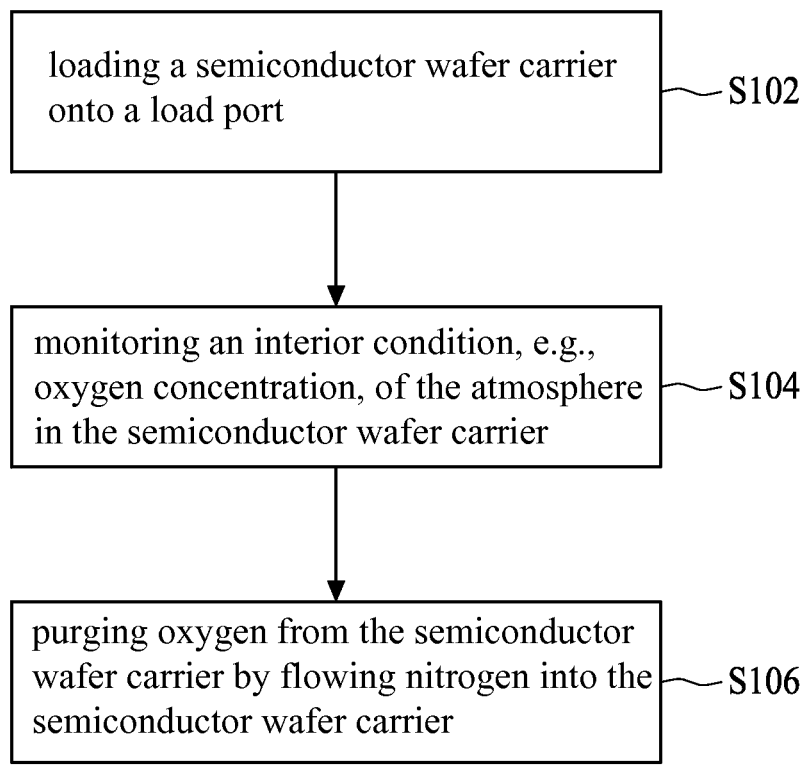
FIG. 4 is a flow diagram of an operation method of an apparatus in accordance with some embodiments of the present disclosure.

FIG. 4 is a flow diagram of an operation method of an apparatus in accordance with some embodiments of the present disclosure.

Referring to FIG. 4, in operation S102, a semiconductor wafer carrier is loaded to a load port. In operation S104, an oxygen concentration in the semiconductor wafer carrier is monitored. In operation S106, oxygen is purged out of the semiconductor wafer carrier by providing nitrogen into the semiconductor wafer carrier. The various operations of FIG. 4 are discussed below in more detail in association with behavioral views corresponding to the operations of the flow diagram.

Figure 5A:
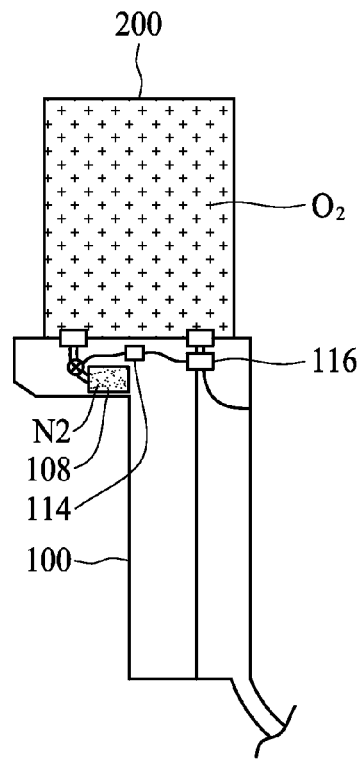
FIGS. 5A to 5C are cross-sectional views of an apparatus at various stages of performing a method in accordance with some embodiments of the present disclosure.
Figure 5B:
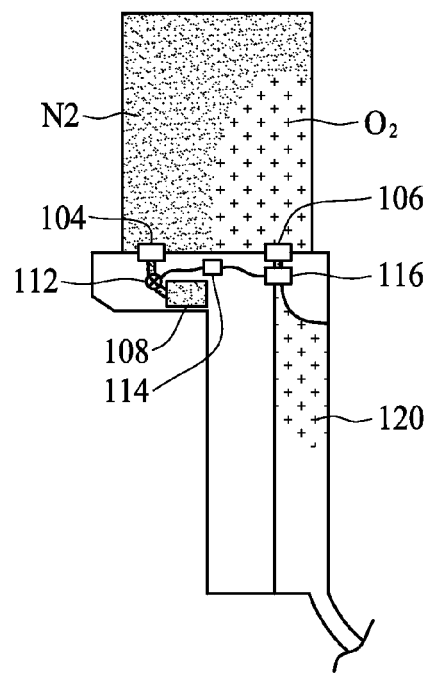
Figure 5C:
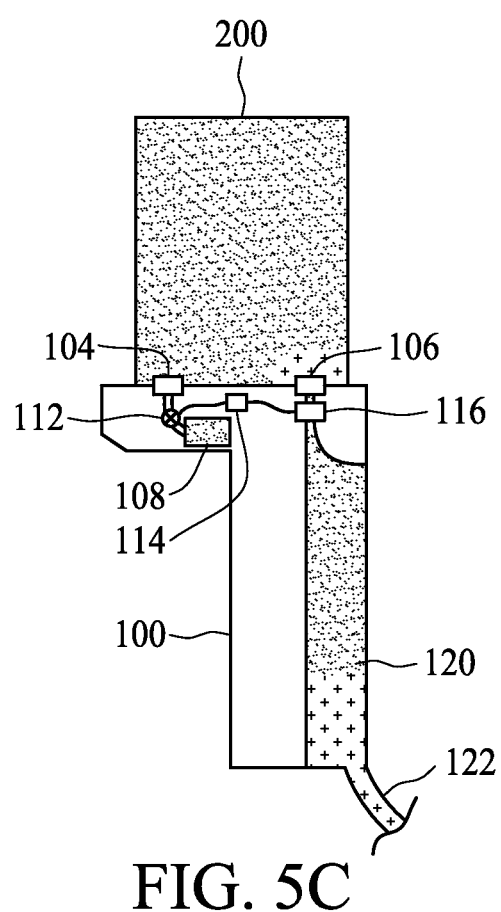

FIGS. 5A to 5C are cross-sectional views of an apparatus at various stages of performing a method in accordance with some embodiments of the disclosure.

In FIG. 5A, the semiconductor wafer carrier 200 is received by the load port 100. Nitrogen in the gas source 108 has not been supplied into the semiconductor wafer carrier 200 yet. In certain embodiments, the sensor 116 detects an ambient condition in the semiconductor wafer carrier 200 and transmits the ambient condition detected to the controller 114.

In FIG. 5B, the controller 114 adjusts the control valve 112 so as to manipulate the nozzle 104 to provide nitrogen into the semiconductor wafer carrier 200. Due to the nitrogen supply, oxygen in the semiconductor wafer carrier 200 is purged out or removed through the venting hole 106 and enters the exhaust buffer 120. In some embodiments, the controller 114 is configured to flow or discharge nitrogen into the semiconductor wafer carrier 200 for a predetermined period of time whenever a semiconductor wafer carrier 200 is mounted on the load port 100. In certain embodiments, the controller 114 is configured to receive the ambient condition detected by the sensor 116. The controller 114 compares the ambient condition with a predetermined value and determines whether a specific event occurs. For example, the specific event is oxygen concentration over 2% or humidity level over 20%. In response to the occurrence of the specific event, the controller 114 adjusts the nitrogen provided by the gas source 108 by manipulating the control valve 112.

In FIG. 5C, nitrogen continues to be provided into the semiconductor wafer carrier 200. Oxygen in the semiconductor wafer carrier 200 is purged out or removed through the venting hole 106 by the nitrogen provided. The purged gases, which include oxygen and nitrogen, enter the exhaust buffer and will be lead out of the load port 100 through the foreline 122. Accordingly, a substantially oxygen free environment is generated in the semiconductor wafer carrier 200. In some embodiments, the substantially oxygen free environment has an oxygen concentration below about 3%. In certain embodiments, the oxygen concentration of the substantially oxygen free environment is close to about 0.0%.

Figure 6:
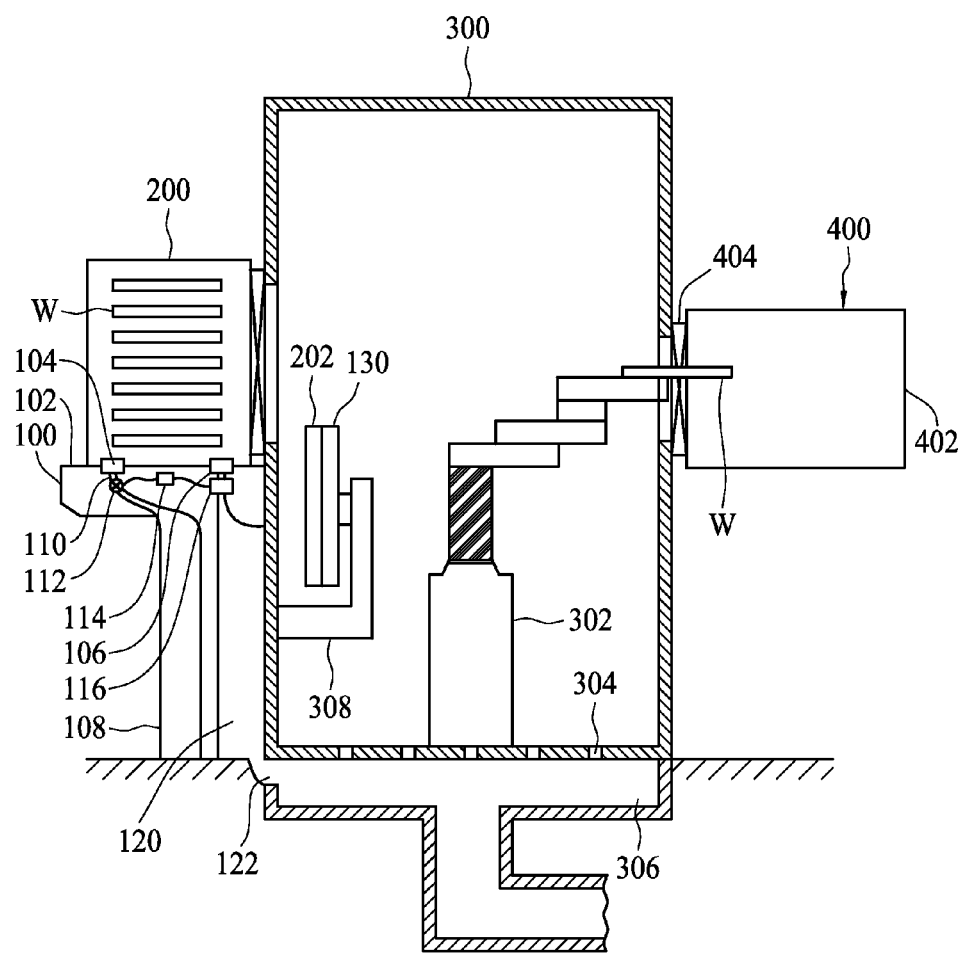
FIG. 6 is a semiconductor wafer process system in accordance with some embodiments of the present disclosure.

FIG. 6 is a semiconductor wafer process system in accordance with some embodiments of the present disclosure.

Referring to FIG. 6, a semiconductor wafer process system 10 having an interface apparatus 300 between a load port 100 and a semiconductor manufacturing equipment 400 is provided. The load port 100 and the semiconductor manufacturing equipment 400 are connected at different sidewalls of the interface apparatus 300. In certain embodiments, the load port 100 and the semiconductor manufacturing equipment 400 are connected or attached to opposite sidewalls of the interface apparatus 300.

In some embodiments in accordance with the present disclosure, the semiconductor manufacturing equipment 400 represents a load lock chamber of a semiconductor wafer manufacturing tool. Although not show in detail, the load lock chamber 400 includes a chamber 402 that can be hermetically sealed and a door 404 disposed at the back of the chamber 402 so as to allow a semiconductor wafer or a semiconductor wafer cassette to be introduced into the chamber 402.

In some embodiments in accordance with the present disclosure, the interface apparatus 300 is designed to perform various processes, for example, a semiconductor wafer load process and a semiconductor wafer transport process. For example, the interface apparatus 300 is configured to load a semiconductor wafer W from a semiconductor wafer carrier 200 configured on the load port 100 to the semiconductor manufacturing equipment 400 by a robot 302. The bottom surface of the interface apparatus 300 includes exhaust openings 304 for discharging gas (e.g. oxygen or nitrogen) from the inner space of the interface apparatus 300. The exhaust openings 304 are connected to a foreline 306, which is configured to lead gas away from the interface apparatus 300. In certain embodiments, a pump is disposed at the exhaust openings 304 to provide suction force so as to vacuum the inner space of the interface apparatus 300.

In some embodiments in accordance with the present disclosure, the load port 100 is configured to receive a semiconductor wafer carrier 200 at an upper surface 102 of the load port 100. The semiconductor wafer carrier 200 has a door 202 at its sidewall. The load port 100 supports the semiconductor wafer carrier 200 and brings the door 202 of the semiconductor wafer carrier 200 into tight contact with a load port door 130. In some embodiments, the door 202 is latched with the load port door 130. A door opener 308 for opening and closing the door 202 of the semiconductor wafer carrier 200 is provided proximal to the load port 100.

Because the door 202 and the load port door 130 are tightly engaged, the door opener 308 simultaneously opens the door 202 of the semiconductor wafer carrier 200 and the load port door 130.

In some embodiments in accordance with the present disclosure, the semiconductor wafer process system 10 includes a nozzle 104 configured to purge the semiconductor wafer carrier 200 when engaged with the load port 100. The nozzle 104 is connected to a gas source 108 filled with nitrogen. When nitrogen is introduced into the semiconductor wafer carrier 200 through the nozzle 101, a substantially oxygen free environment is generated in the semiconductor wafer carrier 200. In some embodiments, the gas source 108 is disposed at the load port 100. In certain embodiments, the gas source 108 is disposed at the interface apparatus 300.

In some embodiments in accordance with the present disclosure, the load port 100 includes a venting hole 106 configured to lead gas out of the semiconductor wafer carrier 200. Below the venting hole 106, a body of the load port includes an exhaust buffer 120. Accordingly, gas lead out of the semiconductor wafer carrier 200 flows into the exhaust buffer 120, which connects to a foreline 122. The foreline 122 is configured to lead gas away from the semiconductor wafer process system 10. In some embodiments, the foreline 122 is connected to the foreline 306 of the interface apparatus 300.

In some embodiments in accordance with the present disclosure, the semiconductor wafer process system 10 includes a gas line 110 connecting the nozzle 104 and the gas source 108. The nozzle 104 is configured to receive nitrogen from the gas source 108. A control valve 112 is provided between the nozzle 104 and the gas source 108. A controller 114 is connected to the control valve 112 so as to adjust the control valve 112. Accordingly, the controller 114 is configured to control the flow of nitrogen provided through the nozzle 104. For example, the controller 114 configures the nozzle 104 to provide nitrogen for a predetermined period of time whenever a semiconductor wafer carrier 200 is received by the load port 100.

In some embodiments in accordance with the present disclosure, the semiconductor wafer process system 10 includes a sensor 106 connected to the controller 114. The sensor 116 is disposed at the load port 110 proximal to the venting hole 106 and configured to monitor an ambient condition in the semiconductor wafer carrier 200. The sensor 116 is further configured to transmit the ambient condition information to the controller 114. The controller 114 compares the ambient condition information with a predetermined value and determines whether a specific event has occurred. For example, the specific event is oxygen concentration over 2% or humidity level over 20%. According to the determination, the controller 114 adjusts the control valve 112 so as to manipulate the nitrogen provided by the nozzle 104.

It is to be noted that although the components such as the gas source 108, the gas line 110, the control valve 112, the controller 114, the sensor 116, the exhaust buffer 120, etc. are provided within the load port 100, it is not so limited. In some embodiments, one or more of the aforementioned components are disposed in the interface apparatus 300. In certain embodiments, part of element(s) is disposed in the load port 100, and the other part of the element(s) is disposed in the interface apparatus 300. In addition, the aforementioned elements can be in any layout deemed fit by persons having ordinary skill in the art.

In some embodiments in accordance with the present disclosure, the sensor 116 is a humidity sensor. The humidity sensor is configured to monitor a humidity level in the semiconductor wafer carrier 200. In certain embodiments, when a humidity level in the semiconductor wafer carrier 200 is above about 20%, the controller 114 is configured to adjust the control valve 112 to provide nitrogen into the semiconductor wafer carrier 200 through the nozzle 104. Accordingly, a substantially oxygen free environment is generated in the semiconductor wafer carrier 200.

In some embodiments in accordance with the present disclosure, the sensor 116 is an oxygen sensor. The oxygen sensor is configured to monitor an oxygen concentration in the semiconductor wafer carrier 200. The oxygen sensor is a chemical oxygen sensor or an optical oxygen sensor. In certain embodiments, when an oxygen concentration in the semiconductor wafer carrier 200 is above about 2%, the controller 114 is configured to adjust the control valve 112 to provide nitrogen into the semiconductor wafer carrier 200 through the nozzle 104. Accordingly, a substantially oxygen free environment is generated in the semiconductor wafer carrier 200.

In some embodiments in accordance with the present disclosure, nitrogen is configured to be introduced into the semiconductor wafer carrier 200 when the door 202 is opened by the door opener 308. In other words, when the mini-environment within the semiconductor wafer carrier 200 is broken, the controller 114 receives a change of the ambient condition from the sensor 116 and accordingly manipulates the nitrogen output of the nozzle 104. In certain embodiments, nitrogen is configured to be introduced into the semiconductor wafer carrier 200 when the door 202 is closed and secured. For example, the controller receives Q-time information of the semiconductor wafer carrier 200 from a semiconductor wafer process stage other than the present one. If the Q-time reaches a predetermined value, a warning message will be generated and the controller 114 is configured to manipulate the nitrogen output of the nozzle 104. Accordingly, a substantially oxygen free environment is maintained in the semiconductor wafer carrier 200.

Figure 7:
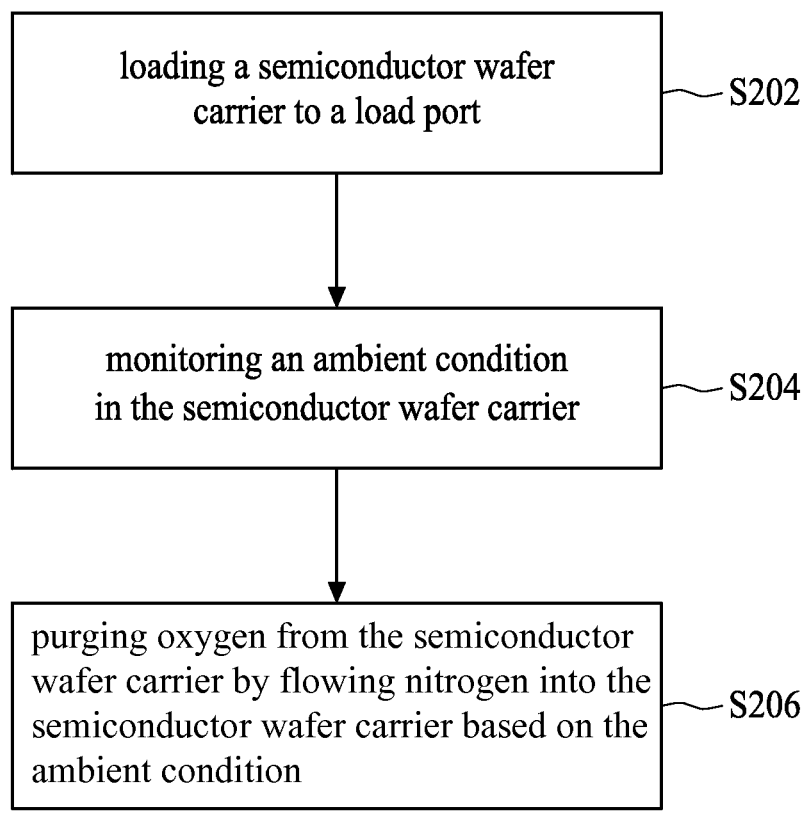
FIG. 7 is a flow diagram of an operation method of an apparatus in accordance with some embodiments of the present disclosure.

FIG. 7 is a flow diagram of an operation method of an apparatus in accordance with some embodiments of the present disclosure.

Referring to FIG. 7, in operation S202, a semiconductor wafer carrier is loaded to a load port. In operation S204, an ambient condition in the semiconductor wafer carrier is monitored. In operation S206, a determination is made based on the ambient condition whether a specific event has occurred. For example, if it is determined that an oxygen concentration in the semiconductor wafer carrier 200 is over a predetermined value, oxygen is purged out of the semiconductor wafer carrier by providing nitrogen into the semiconductor wafer carrier. The various operations of FIG. 7 are discussed below in more detail in association with behavioral views corresponding to the operations of the flow diagram.

Figure 8A:
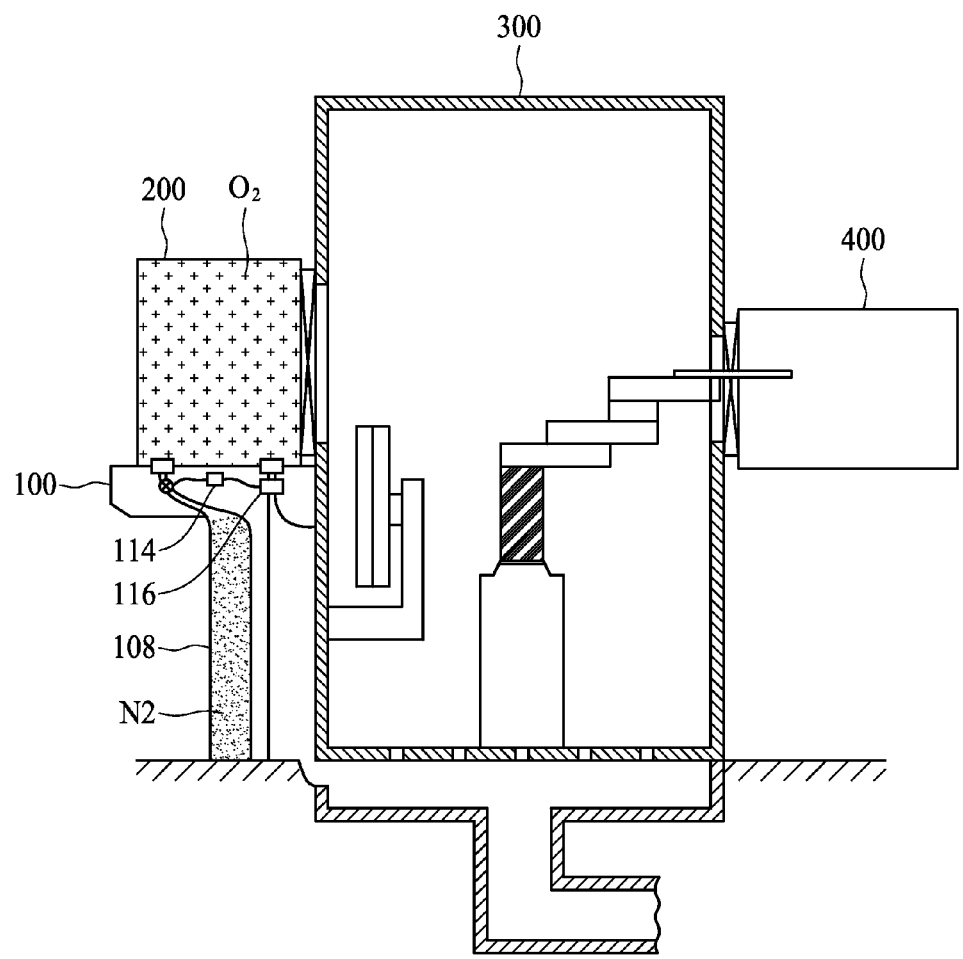
FIGS. 8A to 8C are cross-sectional views of an apparatus at various stages of performing a method in accordance with some embodiments of the present disclosure.
Figure 8B:
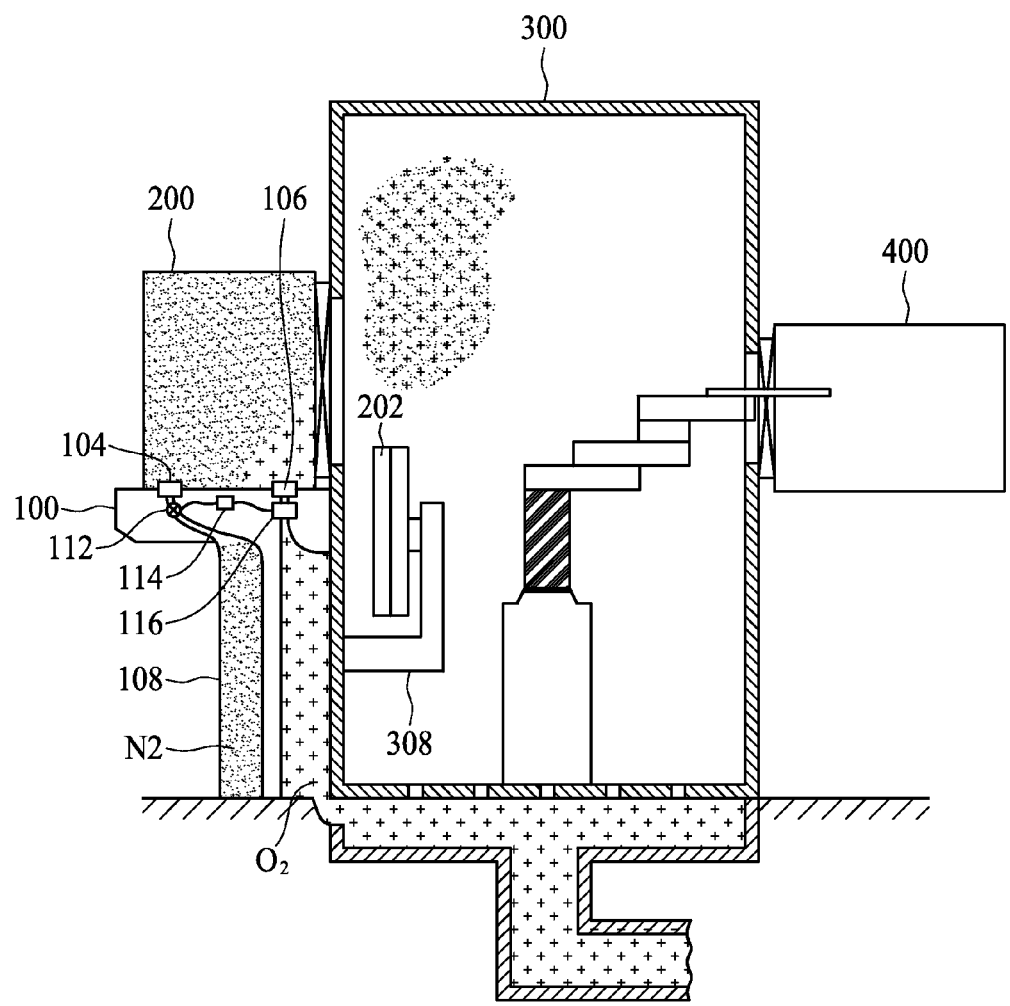

FIGS. 8A and 8B are cross-sectional views of an apparatus at various stages of performing a method in accordance with some embodiments of the present disclosure.

Referring to FIG. 8A, the semiconductor wafer carrier 200 is lowered onto or positioned on the load port 100. Initially, nitrogen in the gas source 108 is not supplied into the semiconductor wafer carrier 200. In certain embodiments, the sensor 116 monitors an ambient condition in the semiconductor wafer carrier 200 and transmits the ambient condition detected to the controller 114.

Referring to FIG. 8B, the controller 114 provides nitrogen into the semiconductor wafer carrier 200. For example, in some embodiments, the controller 114 is configured to provide nitrogen whenever a semiconductor wafer carrier 200 is loaded or positioned on the load port 100. Alternatively, in some embodiments in accordance with the present disclosure, the controller 114 compares the ambient condition information with a predetermined value and determines whether a specific event has occurred. For example, the specific event is oxygen concentration over 2% or humidity level over 20%. In response to the occurrence of the specific event, the controller 114 adjusts the nitrogen provided by the gas source 108 by manipulating the control valve 112. As a result, nitrogen is provided into the semiconductor wafer carrier 200 through the nozzle 104. Oxygen in the semiconductor wafer carrier 200 is purged out through the venting hole 106. In some embodiments, the door 202 of the semiconductor wafer carrier 200 is opened by the door opener 308. Accordingly, oxygen in the semiconductor wafer carrier 200 is purged or discharged through opened door 202.

Figure 8C:
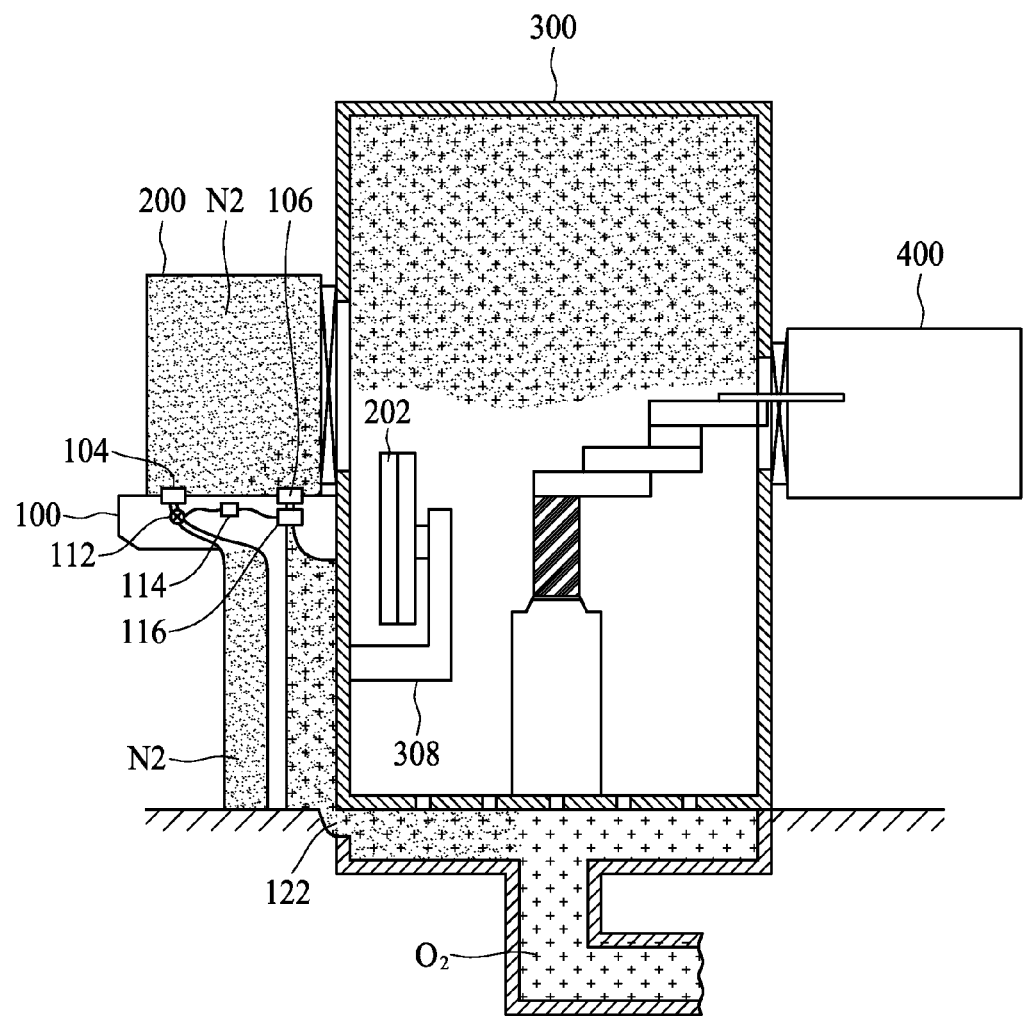

In FIG. 8C, nitrogen continues to be provided into the semiconductor wafer carrier 200. Oxygen in the semiconductor wafer carrier 200 is purged or removed through the venting hole 106 by the introduction of nitrogen into the semiconductor wafer carrier 200. In certain embodiments, the venting hole 106 is not disposed at the bottom of the semiconductor wafer carrier 200. For example, the venting hole 106 is configured on the side of the semiconductor wafer carrier 200. The purged gases, which include oxygen and nitrogen, enter the exhaust buffer and flow out of the load port 100 through the foreline 122. In certain embodiments, the purged gases escape, or are released, from the semiconductor wafer carrier 200 through the opened door 202. Accordingly, a substantially oxygen free environment is generated or produced in the semiconductor wafer carrier 200. In some embodiments, the substantially oxygen free environment has an oxygen concentration below about 3%. In certain embodiments, the oxygen concentration of the substantially oxygen free environment is close to about 0.0%. In addition, an environment in the semiconductor wafer carrier 200 having a humidity level between about 5% and 10% is generated. After the substantially oxygen free environment is generated, nitrogen is continuously provided into the semiconductor wafer carrier 200 as long as the door 202 is not closed. Alternatively, the controller 114 is configured to adjust the control valve 112 and cease the nozzle 104 from further providing nitrogen into the semiconductor wafer carrier 200 in response to the updated ambient condition detected by the sensor 116. Subsequently, in some embodiment, when the occurrence of a specific event is determined by the controller 114, nitrogen introduction into the semiconductor wafer carrier 200 is resumed so as to maintain a substantially oxygen free environment in the semiconductor wafer carrier 200.

Figure 9:
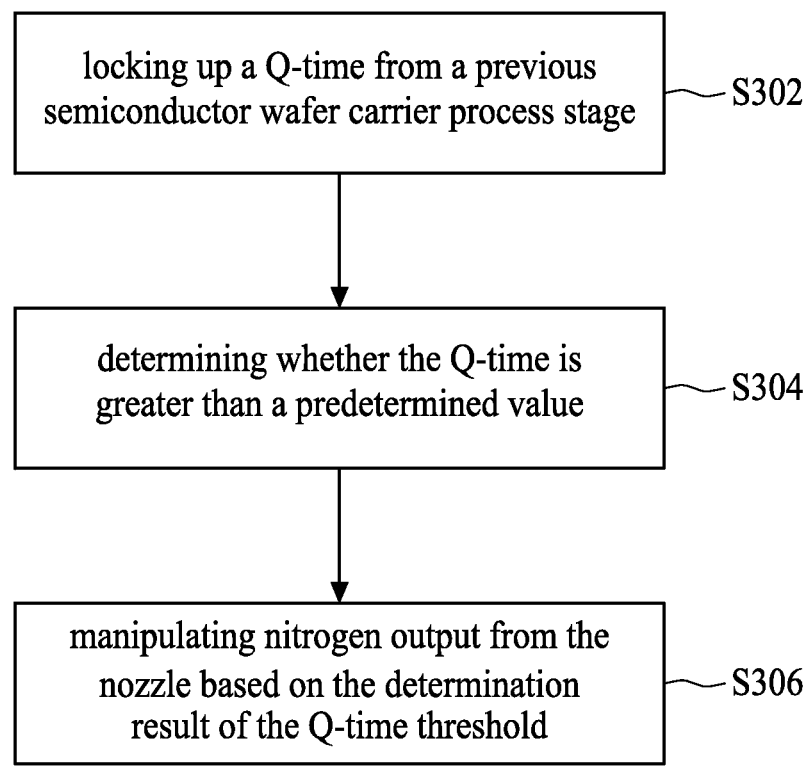
FIG. 9 is a flow diagram of an operation method of an apparatus in accordance with some embodiments of the present disclosure.

FIG. 9 is a flow diagram of an operation method of an apparatus in accordance with some embodiments of the present disclosure.

Referring to FIG. 9, in operation S302, a Q-time is looked up from a previous semiconductor wafer process stage. After the semiconductor wafer is processed by and leaves the previous semiconductor wafer process stage, a Q-time is assigned to the semiconductor wafer. The Q-time information is recorded is a memory of a central control system. The Q-time represents the duration that a semiconductor wafer has stayed unprocessed. Periodically, the semiconductor wafer needs to be treated or processed to reset the Q-time. In some embodiments, if the Q-time exceeds a certain value, the yield of the final product of the semiconductor wafer manufacturing process will be affected.

In operation S304, a controller compares the Q-time and determines whether the Q-time is greater than a predetermined value. For example, a high Q-time means that the semiconductor wafer has stayed in a certain ambient condition for too long and undesired defects are more likely to form on the semiconductor wafer.

In operation S306, if the controller determines that the Q-time is greater than a predetermined value, the controller manipulates a nozzle to provide nitrogen into the semiconductor wafer carrier so as to reset the Q-time. By introducing nitrogen, a substantially oxygen free environment is generated in the semiconductor wafer carrier. Accordingly, chances that undesired defected form on the semiconductor wafer is reduced. In some embodiments, the controller controls a control valve between the nozzle and the gas source to manipulate the nitrogen output. In certain embodiments, the controller receives multiple information for a multi-factored determination of whether to initiate introducing nitrogen into the semiconductor wafer carrier. Such information includes Q-time, oxygen concentration, pressure level, humidity level, and so on.

In some embodiment, an apparatus having a body and a surface configured to receive a semiconductor wafer carrier is provided. A nozzle is provided on the surface and connected to a gas source through a gas line. The semiconductor wafer carrier has a capped opening at its bottom configured to be accessible by the nozzle. In other words, a passageway or flow path for introducing gas into the semiconductor wafer carrier is formed when the semiconductor wafer carrier is received by the apparatus. The nozzle is configured to provide a gas output from the gas source to the semiconductor wafer carrier so as to purge the semiconductor wafer carrier. Consequently, a substantially oxygen free environment within the semiconductor wafer carrier is generated. A venting hole is provided on the surface of the apparatus, and configured to lead gas out of the semiconductor wafer carrier.

In some embodiments, a sensor is provided within the body of the apparatus, and configured to monitor an ambient condition in the semiconductor wafer carrier. A controller within the body is provided. The controller is connected to a sensor and a control valve. The controller is configured to adjust the control valve based on the ambient condition received from the sensor so as to manipulate the gas output provided by the nozzle.

In some embodiments, the gas output is an inert gas. In certain embodiments, the gas output is nitrogen.

In some embodiments, a diffuser is provided at the nozzle. The diffuser is configured to adjust flow direction, speed or rate of the gas output from the nozzle. In certain embodiments, the diffuser is configured to enable the nozzle to provide a more uniform gas output. In some embodiments, a filter is disposed in the nozzle.

In some embodiments, a suction unit is provided at, or downstream of, the venting hole. The suction unit is configured to vacuum the semiconductor wafer carrier. In certain embodiments, the suction unit is connected to the control valve to be manipulated by the controller based on the ambient condition detected by the sensor.

In some embodiments, the sensor is a flow meter proximal to, or upstream of, the nozzle, and configured to monitor a flow rate of the gas output. In some embodiments, the sensor is a humidity sensor proximal to, or downstream of, the venting hole, and configured to monitor a humidity level in the semiconductor wafer carrier. In some embodiments, the sensor is an oxygen sensor proximal to, or downstream of, the venting hole, and configured to monitor an oxygen concentration in the semiconductor wafer carrier. In some embodiments, the sensor is a pressure sensor configured to monitor a pressure level in the semiconductor wafer carrier.

In some embodiment, a semiconductor wafer process system having a load port is provided. In some embodiments, the load port is connected to a sidewall of an interface apparatus, and the load port is configured to receive a semiconductor wafer carrier at a surface thereof, such as a horizontal or substantially horizontal surface thereof. The interface apparatus is configured between the load port and semiconductor manufacturing equipment. The semiconductor manufacturing equipment is connected to the interface apparatus at a sidewall different from that of the load port. The interface apparatus includes a robot configured to transfer a semiconductor wafer between the semiconductor wafer carrier and the semiconductor manufacturing equipment. The load port includes a nozzle connected to a gas source located within or outside of the interface apparatus, and configured to purge the semiconductor wafer carrier with nitrogen when the semiconductor wafer carrier is engaged with, or positioned on, the load port. Accordingly, a substantially oxygen free environment is generated or produced within the semiconductor wafer carrier.

In some embodiments, the interface apparatus has a door opener proximal to the load port. The door opener corresponds to a door at a sidewall of the semiconductor wafer carrier, and is configured to open the door when the semiconductor wafer carrier is received by the load port. In addition, when the door opener is engaged and opens the door of the semiconductor wafer carrier, the load port is configured to purge nitrogen into the semiconductor wafer carrier.

In some embodiments, the load port has a venting hole at the surface. In addition, the load port includes a body below the upper surface. The body is configured to receive purged nitrogen from the semiconductor wafer carrier through the venting hole.

In some embodiments, the interface apparatus includes a gas line configured to connect the nozzle and the gas source. A control valve is provided between the nozzle and the gas source. A sensor is provided at the load port, and configured to monitor an ambient condition in the semiconductor wafer carrier. A controller is connected to the control valve and the sensor, and configured to receive the ambient condition detected by the sensor and adjust the control valve based on the ambient condition so as to manipulate the nitrogen output provided by the nozzle.

In some embodiments, the sensor is an oxygen sensor configured to monitor an oxygen concentration in the semiconductor wafer carrier. In certain embodiments, the sensor is a humidity sensor configured to monitor a humidity level in the semiconductor wafer carrier.

In some embodiments, a method for manufacturing semiconductor wafer is provided. A semiconductor wafer carrier is loaded to a load port. An oxygen concentration in the semiconductor wafer carrier is monitored. Nitrogen is provided into the semiconductor wafer carrier so as to purge oxygen out of the semiconductor wafer carrier. In certain embodiments, the operation of purging oxygen out of the semiconductor wafer carrier is configured to keep a humidity level in the semiconductor wafer carrier between about 5% and about 10%.

In some embodiments, nitrogen is provided into the semiconductor wafer carrier when a door of the semiconductor wafer carrier is opened.

In some embodiments, a Q-time from a previous semiconductor wafer process stage is looked up and processed. A determination is made as to whether the Q-time is greater than a predetermined value. Different concentrations, flow rates, and pressures of nitrogen are provided or introduced into the semiconductor wafer carrier based on the determination made.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus, comprising:
   a body including a surface, wherein the surface is configured to receive a semiconductor wafer carrier;
   a nozzle on the surface, wherein the nozzle is connected to a gas source through a gas line, and the nozzle is configured to provide a gas output from the gas source to the semiconductor wafer carrier, wherein the semiconductor wafer carrier includes a capped opening at a surface thereof, configured to couple with the nozzle to provide the gas output to the semiconductor wafer carrier so as to generate a substantially oxygen free environment within the semiconductor wafer carrier;
   a venting hole on the surface, wherein the venting hole is configured to allow gas flow from the semiconductor wafer carrier;
   a sensor within the body, wherein the sensor is configured to monitor an ambient condition in the semiconductor wafer carrier; and
   a controller within the body, wherein the controller is connected to the sensor and a control valve, wherein the controller is configured to receive the ambient condition detected by the sensor and adjust the control valve based on the ambient condition so as to control the gas output from the nozzle.

2. The apparatus according to claim 1, wherein the gas output is an inert gas.

3. The apparatus according to claim 1, further comprising:
   a diffuser at the nozzle, wherein the diffuser is configured to adjust flow direction, speed or rate of the gas output.

4. The apparatus according to claim 1, further comprising a filter in the nozzle.

5. The apparatus according to claim 1, further comprising:
   a suction unit at the venting hole, wherein the suction unit is configured to vacuum the semiconductor wafer carrier.

6. The apparatus according to claim 1, wherein the sensor is a flow meter proximal to the nozzle, wherein the flow meter is configured to monitor at least a flow rate of the gas output.

7. The apparatus according to claim 1, wherein the sensor is a humidity sensor proximal to the venting hole, wherein the humidity sensor is configured to monitor a humidity level in the semiconductor wafer carrier.

8. The apparatus according to claim 1, wherein the sensor is an oxygen sensor proximal to the venting hole, wherein the oxygen sensor is configured to monitor an oxygen concentration in the semiconductor wafer carrier.

9. The apparatus according to claim 1, wherein the sensor is a pressure sensor configured to monitor a pressure level in the semiconductor wafer carrier.

10. A semiconductor wafer process system, comprising:
a load port has a body including a surface, wherein the surface is configured to receive a semiconductor wafer carrier, the load port comprising:
   a nozzle on the surface, wherein the nozzle is connected to a gas source through a gas line, and the nozzle is configured to provide a gas output from the gas source to the semiconductor wafer carrier, wherein the semiconductor wafer carrier includes a capped opening at a surface thereof, configured to couple with the nozzle to provide the gas output to the semiconductor wafer carrier so as to generate a substantially oxygen free environment within the semiconductor wafer carrier;
   a venting hole on the surface, wherein the venting hole is configured to allow gas flow from the semiconductor wafer carrier;
   a sensor within the body, wherein the sensor is configured to monitor an ambient condition in the semiconductor wafer carrier; and
   a controller within the body, wherein the controller is connected to the sensor and a control valve, wherein the controller is configured to receive the ambient condition detected by the sensor and adjust the control valve based on the ambient condition so as to control the gas output from the nozzle; and
an interface apparatus between the load port and a semiconductor manufacturing equipment, wherein the load port and the semiconductor manufacturing equipment are connected at different side walls of the interface apparatus, wherein the interface apparatus is configured to transmit a semiconductor wafer between the semiconductor wafer carrier and the semiconductor manufacturing equipment by a robot,
wherein the load port is configured to purge the semiconductor wafer carrier with nitrogen through the nozzle when the semiconductor wafer carrier is engaged with the load port so as to generate the substantially oxygen free environment within the semiconductor wafer carrier,
wherein the nozzle is connected to the gas source in the interface apparatus.

11. The semiconductor wafer process system according to claim 10, wherein the interface apparatus comprises a door opener proximal to the load port, and the door opener is configured to open a door at a sidewall of the semiconductor wafer carrier,
wherein the load port is configured to purge nitrogen into the semiconductor wafer carrier when the door opener is not at an opened position.

12. The semiconductor wafer process system according to claim 10, wherein the load port comprises the body below an upper surface of the load port,
wherein the body is configured to receive purged nitrogen from the semiconductor wafer carrier through the venting hole of the load port.

13. The semiconductor wafer process system according to claim 10, wherein:
the gas line is configured to connect the nozzle and the gas source;
the control valve is between the nozzle and the gas source; and
the controller is connected to the control valve and the sensor, wherein the sensor is disposed at the load port and configured to monitor the ambient condition in the semiconductor wafer carrier,
wherein the controller is configured to receive the ambient condition detected by the sensor and adjust the control valve based on the ambient condition so as to control the nitrogen from the nozzle.

14. The semiconductor wafer process system according to claim 13, wherein the sensor is an oxygen sensor, and the oxygen sensor is configured to monitor an oxygen concentration in the semiconductor wafer carrier.

15. The semiconductor wafer process system according to claim 13, wherein the sensor is a humidity sensor, and the humidity sensor is configured to monitor a humidity level in the semiconductor wafer carrier.

16. An apparatus, comprising:
a load port having a surface and configured to receive a semiconductor wafer carrier including a first capped opening and a second capped opening, the load port comprising:
   a nozzle on the surface, configured to provide a gas to the semiconductor wafer carrier by coupling with the first capped opening so as to generate a substantially oxygen free environment within the semiconductor wafer carrier;
   a venting hole on the surface, configured to allow gas flow from the semiconductor wafer carrier by coupling with the second capped opening; and
   a controller within the load port, configured to adjust a control valve based on an ambient condition in the semiconductor wafer carrier so as to control the gas output from the nozzle.

17. The apparatus according to claim 16, wherein the gas output is an inert gas.

18. The apparatus according to claim 16, further comprising:
a diffuser at the nozzle, wherein the diffuser is configured to adjust flow direction, speed or rate of the gas output.

19. The apparatus according to claim 16, further comprising a filter in the nozzle.

20. The apparatus according to claim 16, further comprising:
a suction unit at the venting hole, wherein the suction unit is configured to vacuum the semiconductor wafer carrier.

* * * * *